United States Patent
Baudet

(10) Patent No.: US 6,291,277 B1
(45) Date of Patent: *Sep. 18, 2001

(54) METHOD OF MANUFACTURING A SEMICONDUCTOR DEVICE INCLUDING ETCHING OF A STACK OF LAYERS BY MEANS OF PHOTOLITHOGRAPHY

(75) Inventor: Pierre Baudet, Yerres (FR)

(73) Assignee: U.S. Philips Corporation, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/400,758

(22) Filed: Sep. 21, 1999

(30) Foreign Application Priority Data

Sep. 22, 1998 (FR) .................................................. 98 11808

(51) Int. Cl.⁷ .................................................. H01L 21/388
(52) U.S. Cl. ........................... 438/167; 257/682; 438/975
(58) Field of Search .................................. 438/167, 975; 257/682

(56) References Cited

U.S. PATENT DOCUMENTS

| | | | |
|---|---|---|---|
| 5,157,003 | 10/1992 | Tsuji et al. ........................... | 437/229 |
| 5,405,797 | 4/1995 | Brugger .................................. | 437/51 |
| 5,483,089 | * 1/1996 | Terazono .............................. | 257/195 |
| 5,597,743 | * 1/1997 | Onda et al. .......................... | 438/172 |

\* cited by examiner

Primary Examiner—Richard Elms
Assistant Examiner—Christian D. Wilson
(74) Attorney, Agent, or Firm—Steven R. Biren

(57) ABSTRACT

The invention relates to a method of manufacturing an integrated semiconductor device on a substrate (1), comprising steps to manufacture a stack of layers (2, 3, 4, 5) on the substrate, and steps to manufacture circuit elements by means of photolithography including the formation of a centering mask, the formation of a reference pattern through an opening in this mask, and the formation of masks for defining circuit elements centered on the reference pattern. This method comprises the formation of at least one circuit element (12) provided with electrically insulating means in lateral regions (11), the formation of the centering mask of the masks defining the integrated circuit elements, by means of a first mask defining the lateral insulation regions of this circuit element, and the formation of the reference pattern by the pattern (20) formed by etching, through the first mask, to a depth which does not exceed the thickness of the upper layer (5) of the stack of layers in said lateral insulation regions (11).

4 Claims, 3 Drawing Sheets

METHOD OF MANUFACTURING A SEMICONDUCTOR DEVICE INCLUDING ETCHING OF A STACK OF LAYERS BY MEANS OF PHOTOLITHOGRAPHY

FIELD OF THE INVENTION

The invention relates to a method of manufacturing an integrated semiconductor device on a substrate, comprising steps wherein a stack of layers is manufactured on the substrate, and photolithographic etching steps including the formation of a centering mask, the formation of a reference pattern through an opening in the mask, and the formation of masks defining circuit elements centered on this reference pattern.

The invention also relates to a semiconductor device manufactured by means of said method.

The invention is used in the manufacture of circuits operating in the millimeterwave range, which are commonly referred to as monolithic hyperfrequency integrated circuits on a substrate (MMICs). The circuits are used, in particular, in telecommunication systems, and should be characterized by high performance and low cost.

BACKGROUND OF THE INVENTION

A manufacturing method and a layout for a monolithic hyperfrequency integrated circuit on a substrate (MMIC) is disclosed in patent specification U.S. Pat. No. 5,405,797 (Brugger). A Schottky diode and a HFET are manufactured in accordance with a semi-planar layout on the basis of a stack of layers composed of semiconducting materials. The object is to provide a simpler method of obtaining the layout. To achieve this, the method used in said document enables contact regions of the Schottky diode and of the HIFET to be manufactured simultaneously.

HFET is to be taken to mean a field effect transistor having a heterostructure. The above-described method of producing a layout comprises a first step of growing a first group S of epitaxial layers on a semi-insulating GaAs substrate. These layers S can suitably be used to manufacture the Schottky diode. The method further includes a step of manufacturing an etch-stop layer A comprising aluminium (Al). Said method further includes a step of photolithographically forming a mask covering the region of the Schottky diode, said mask having apertures delimiting the region of the HFET transistor. An ion implantation 0 is carried out through said apertures to form insulating wells around the diode region in the previously manufactured epitaxial layers. The method further includes a second step of growing a second group H of epitaxial layers throughout the surface of the stop layer, i.e. on the diode region as well as on the insulating wells surrounding it. The epitaxial layers H manufactured in this second growth step can suitably be used to generate the HFET transistor. The method further includes a second photolithographic step to form a mask which covers the transistor region and which includes apertures which delimit the diode region. Through said apertures, the layers H which are specific to the transistor and which are situated above diode layers S in the diode region are eliminated by etching down to the stop layer A. This results in a layout comprising the diode layers S surrounded by insulating wells, and comprising, laterally arranged on these insulating wells, the layers H which are specific to the HFET transistor and which are formed in relief with respect to the diode layers. As a result, the HFET transistor is laterally insulated from the diode by a mesa and vertically by a subjacent insulating well. Next, the photolithographic mask is eliminated and the contacts of the electrodes of the diode and the transistor are simultaneously formed.

In such a manufacturing method, it is necessary to form, prior to the first photolithographic step, a mask centering pattern in a region which is specifically reserved for the substrate. This preliminary stage in the manufacture of a centering pattern is very well known by those skilled in the art and is never described because it is necessarily used on a large scale in all techniques for manufacturing semiconductor devices by means of photolithographic steps. This step of manufacturing a centering pattern is both indispensable and non-pertinent because the centering pattern is not an integrated circuit element.

Consequently, this is a step which is costly in terms of means and the amount of time involved, because it employs a photolithographic mask specifically for forming the centering pattern, and it must be added to the other steps in the manufacture of integrated circuit elements.

In the known manufacturing method, a step of forming the centering pattern must necessarily be carried out by means of a first photolithographic step, followed, in succession, by a second photolithographic step, etching of superposed epitaxial layers, which are necessary to form the transistor and which cover the diode region, which photolithographic steps serve to remove all layers apart from the layers in the transistor region, thereby forming a mesa. This method has drawbacks. First, two successive photolithographic steps are necessary. Second, etching of a number of superposed layers results in a rather high mesa, which adversely affects the formation of conducting strips which are customarily formed to connect electrodes of the element insulated by the mesa to contact pads of other integrated circuit elements situated at a lower level. In the case of a fairly high mesa, the conducting strips are difficult to produce in a uniform thickness and they are liable to fracture when the slope changes.

In addition, a particular drawback resides in that etching of a number of superposed layers causes slope irregularities, referred to as undercutting, which is caused by the fact that the successive layers are composed of different materials having different etch rates, so that the upper layers successively overhang the subjacent layers which are etched one after the other. In this case, also the conducting strips formed on the slopes of the mesa are susceptible to fracture. Even if one of the connections is formed by a buried layer, as suggested in the cited document, the other connections must necessarily be made by means of conducting strips on the slope of the mesa, as a result of which they are fragile.

The known method not only requires a mask which is used specifically for centering, but also each subsequent mask used has a unique function in the formation of the layout.

SUMMARY OF THE INVENTION

It is an object of the invention to reduce the number of masking steps in the manufacturing process of the semiconductor device including photolithographic steps.

This object is achieved in a method of manufacturing an integrated semiconductor device on a substrate, which method includes manufacturing steps as described below.

An advantage of this method resides in that the first mask used in the photolithographic steps has at least two functions: one function being the formation of a centering pattern and the other function being the definition of lateral insulation regions of the circuit element. In this manner, one process step is saved in the method and, in addition, the precision of the method is increased in that the first mask is not brought into alignment with a previously formed pattern, but is used at the same time to form the pattern and define the insulating regions.

Another advantage, which is very important, is that the small mesa formed by etching the upper layer is free of slope irregularities caused by undercutting because etching takes place in only one layer: the mesa of small height is thus incapable of weakening the conducting strips formed on the slopes.

Another advantage resides in that the region reserved for the centering pattern on the substrate is no longer necessary and, thus, one substrate surface can be omitted.

In an embodiment, the lateral insulation of the circuit element is formed in the regions defined by said first mask by ion implantation in the stack of layers.

A semiconductor device manufactured in accordance with this method is cheaper to manufacture and less costly as regards the substrate surface.

BRIEF DESCRIPTION OF THE DRAWINGS

These and other aspects of the invention will be apparent from and elucidated, by way of non-limitative example, with reference to the embodiment(s) described hereinafter.

In the drawings.

DESCRIPTION OF PREFERRED EMBODIMENTS

Figure 1:
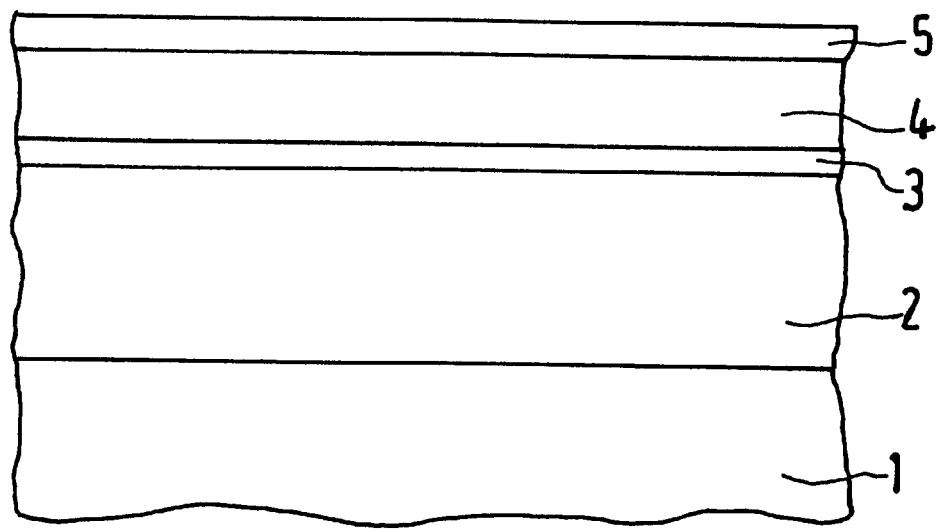
FIG. 1 is a simplified sectional view of a stack of epitaxial layers provided on a substrate to form a transistor with a heterostructure.

Hereinbelow, a description will be given of the invention which, by way of non-limitative example, is used to manufacture, on a substrate, a semiconductor device of the monolithic integrated circuit type for hyperfrequency applications, which is commonly referred to as MMIC (Microwave Monolithic Integrated Circuit). In the example described herein, the circuit comprises at least one active circuit element provided with lateral electrical insulation means. To manufacture this active element a stack of epitaxial layers is formed on a semi-insulating substrate, said stack including, viewed from the substrate, one or more buffer layers for adaptation to the substrate material, one or more layers forming the active transistor region and one or more cap layers, also referred to as cover layers, for adaptation to the materials of the ohmic contact pads of the source and drain. Such a transistor also comprises a Schottky-type gate contact of very small length, generally in the sub-micron range.

In the manufacture of such an active element, it is important for the source and drain contacts to be accurately aligned with respect to each other because the gate contact is formed by aligning it with respect to the source and drain contacts.

To improve the performance of the transistor, the stack of layers is generally made by epitaxial growth and comprises two layers forming a heterostructure. In this manner, an electron gas assembles at the interface of these layers over a small thickness of several nanometers. In this case the gate contact is formed in an aperture whose bottom is at a predetermined distance from said interface. This type of transistor is referred to as PHEMT (Pseudomorphic High Mobility Transistor) or pseudomorphic HEMT.

The practical realization of such an active element includes the steps of etching a recess and the steps of depositing electrode contact pads which are formed by means of a photolithographic technique which includes the manufacture of a mask layer and a suitable resin, insolation of the resin in accordance with a very accurate pattern so as to render it insoluble in the regions to be protected by the mask and to enable windows to be opened in regions which must be subjected to etching or other treatments.

The positioning of the pattern for insolation of the resin has long since taken place in a manner known to those skilled in the art, using a centering pattern formed in a preliminary photolithographic step in a reserved region of the semiconductor device.

The practical realization of the transistor also comprises the formation of electrically insulating regions formed around the transistor. To achieve this, a photolithographic step is included in the manufacturing process to form a mask which protects the surface of the future transistor by means of a resin layer deposited on the cap layer, and which mask opens a window all around the transistor through which ions are implanted to form said electrically insulating regions.

In accordance with the invention, the preliminary step preceding the photolithographic steps is dispensed with. That is to say, once the stack of epitaxial layers has been formed, a specific centering pattern for the photolithographic steps to be carried out is not formed. In accordance with the invention, a single mask which makes the boundary of the pattern defining the insulating regions and the boundary of the centering pattern coincide is used as the mask for the centering pattern and as the mask for defining the insulation regions of the active element or the MMIC transistor. In the example described hereinabove, the boundary of the pattern defining the insulation regions of the transistor constitutes the limit of the active region of the transistor. As this active region is thus protected by the mask, first of all the cap layer is subjected to an etch step, over a part of its thickness or over its entire thickness, around the mask but without exceeding the thickness of the upper layer of the stack of layers, resulting in a pattern having very little relief which, from now on, is the centering pattern for the subsequent photolithographic steps; subsequently, ions which are suitable for electrically insulating the active region of the transistor are implanted around said active region which is still protected by the same mask.

Thus, in accordance with the invention, the very first mask formed during the manufacture of the MMIC is the mask defining the boundary between the active region and the insulating regions of the transistor, said mask being used to form the centering pattern by means of etching to a depth which does not exceed the thickness of the cap layer, and said mask simultaneously being used as an ion implantation mask to render the active layers electrically insulating in the desired regions.

FIG. 1 shows, by way of non-limitative example, a stack of epitaxial layers formed on a semi-insulating substrate 1 of GaAs to manufacture a PHEMT. Viewed from the substrate, this stack comprises: a buffer layer 2 of undoped GaAs having a thickness of the order of 0.5 to 1 µm; two adjacent layers forming a heterostructure, i.e. having different gap widths, the undoped InGaAs layer 3 having a smaller gap width and a thickness of the order of 10 to 15 nm, and the $n^+$-doped AlGaAs layer 4 having a thickness of approximately 20 to 50 nm; subsequently the $n^+$-doped GaAs cap layer 5 having a thickness of approximately 20 to 50 nm. The layer 4 forms an etch-stop layer with respect to the layer 5.

Figure 2:
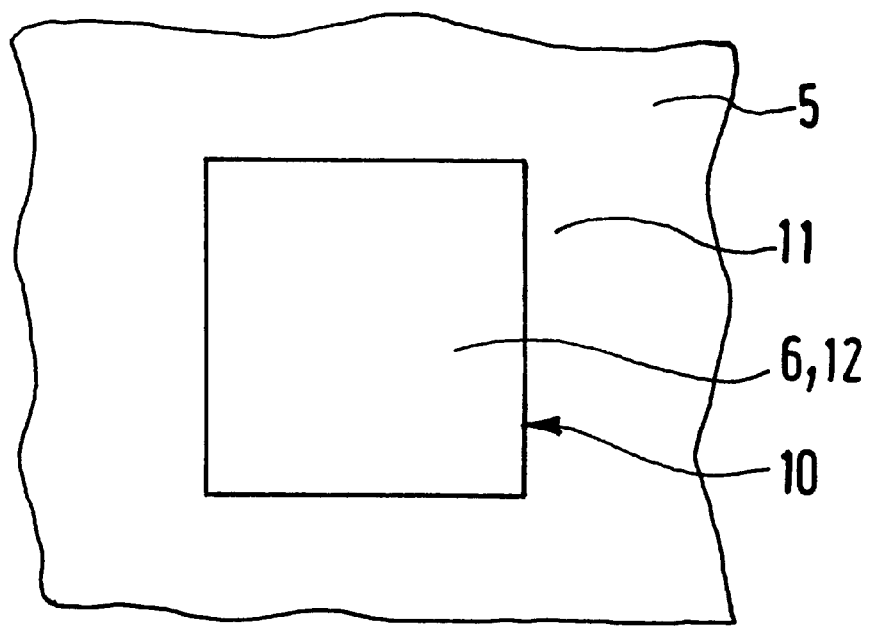
FIG. 2 is a plan view of a mask defining a centering pattern as well as the lateral insulation regions of the transistor, which mask is formed on the surface of the stack of layers.

FIG. 2 is a plan view of a mask 6 formed by means of photolithography in a suitable resin layer covering the subjacent active region referenced 12 of the transistor HEMT while leaving the insulating regions 11 of the transistor on the cap layer 5 uncovered. The boundary between the active region 12 covered by the mask 6 and the insulating regions 11 is referenced 10.

Figure 3A:
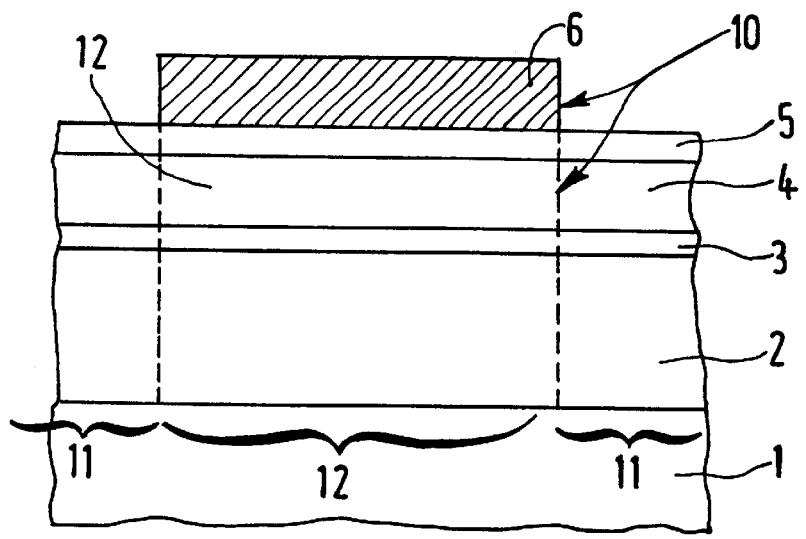
FIG. 3A is a simplified sectional view of a mask formed on the surface of the stack of layers.

FIG. 3A is a sectional view of the mask 6 formed on the surface of the cap layer 5 and delimiting at reference numeral 10 the active region 12 and the insulating regions 11 of the transistor.

Figure 3B:
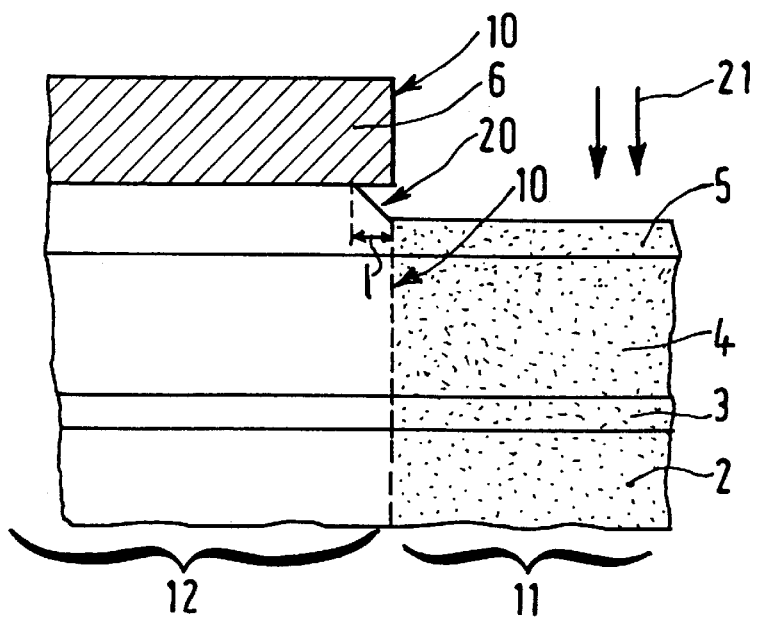
FIG. 3B is a sectional view of the etching step to which the upper layer of the stack is subjected to form the centering pattern, and of the ion implantation carried out in the aperture of the mask to form the lateral insulation of the transistor.

FIG. 3B is a sectional view, on an enlarged scale with respect to FIG. 3A, of the effect of a first etching step carried out in the cap layer 5 over a part of the thickness or over the entire thickness, but leaving the subjacent layer 4 intact. In this etching step, which coincides with the boundary 10, a mini-mesa referenced 20 is formed. The lateral dimension I of the slope of this mini-mesa must not exceed the vertical dimension or thickness of the layer 5. The material of the layer 4, which includes aluminium Al, favorably halts the etching process as soon as the layer 5 is etched. As this layer 5 has a thickness of the order of 20 to 50 nm, this size of 20 to 50 nm also is the positioning accuracy of the reference pattern formed by the etched pattern of the mini-mesa 20. From now on, the mini-mesa 20 is the reference pattern for positioning all subsequent photolithographic masks.

FIG. 3B also shows that the mask 6 serves as an ion implantation mask having a boundary 10 to form insulating wells 11 around the active region 12 of the transistor by means of suitable ions. The ion implantation is carried out in a manner known to those skilled in the art and generally does not necessitate a specific annealing process. The mask 6 is eliminated to continue the manufacture of the HEMT transistor.

Figure 4:
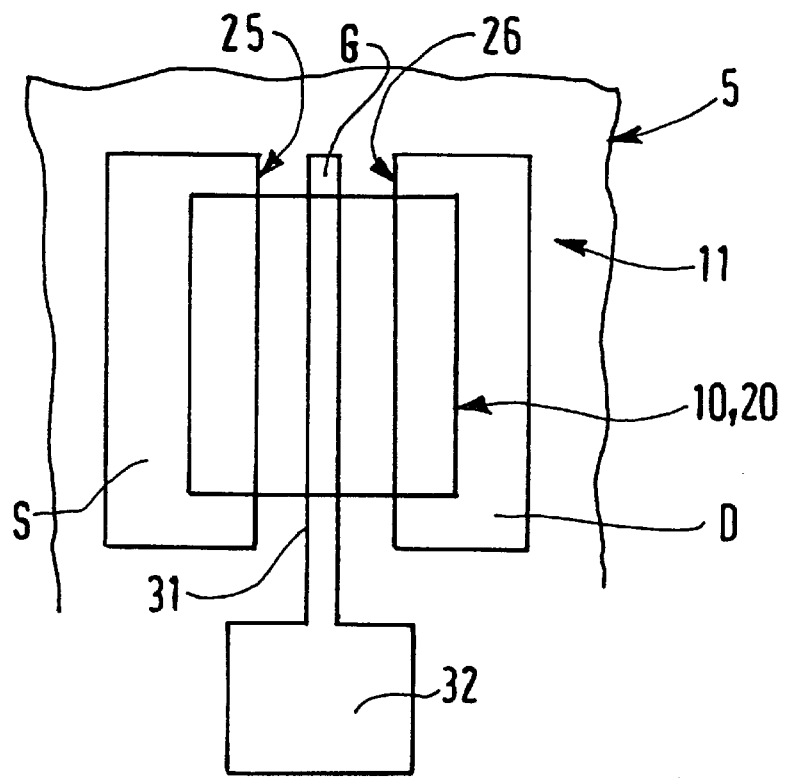
FIG. 4 is a plan view of an example of electrodes used in this transistor.

FIG. 4 is a plan view of an example of the deposition of electrode contacts of the PHEMT transistor. This transistor comprises a source electrode S and a drain electrode D, which are resistive layers deposited on the surface of the cap layer 5 in apertures of a new photolithographic mask centered on the cap layer 5 by means of the reference pattern formed by the mini-mesa 20.

Figure 5:
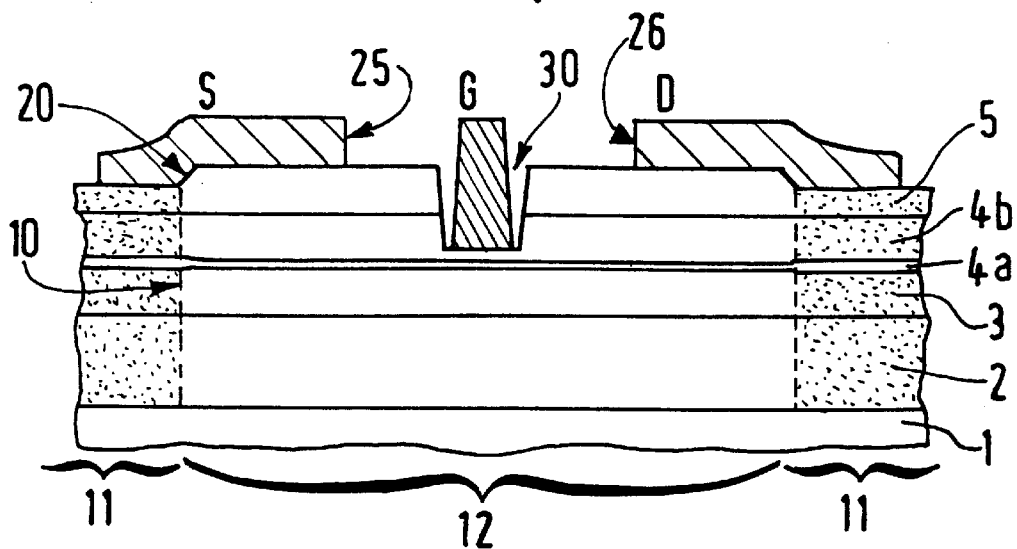
FIG. 5 is a sectional view of an example of such a transistor.

FIG. 5 is a sectional view of the transistor manufactured in accordance with the invention. Once the ohmic contacts S and D are formed on the cap layer 5, a recess 30 is formed in the layers 5 and 4 by etching, whereafter a Schottky-type gate contact G is formed in the recess. Said recess 30 and the Schottky contact G are centered, not by means of the reference pattern 20, but with respect to the edges 25 and 26 of the ohmic contacts. In fact, to maximize the performance of the transistor, the position of the gate G should depend only on the position of said edges 25, 26. In FIG. 4, the layer 4 of the heterostructure 3, 4 comprises two superposed sub-layers 4a, 4b, the sub-layer 4a having a thickness of a few nm being undoped.

Nevertheless, in carrying out this method one masking step in the formation of the reference pattern has been saved. Consequently, a saving in time and an improvement in accuracy has been achieved because each step depending on another step not only extends the process but also slightly affects its precision because, as is known to those skilled in the art, there is always a slight re-centering imprecision. Very important advantages reside in that the mesa is of a very small thickness of less than, or approximately, 50 nm, this thickness being at most equal to the thickness of the cap layer, and in that this mini-mesa is obtained by etching only one layer, so that this mini-mesa is free of undercuttings leading to fracture/changes of the slope As a result, as shown in FIG. 4, the conducting strip 31 connecting the gate G to the gate contact 32 is not weakened by changes in the slope.

What is claimed is:

1. A method of manufacturing an integrated semiconductor device on a substrate, comprising steps to manufacture a stack of layers on the substrate, and steps to manufacture circuit elements by means of photolithography including the formation of a centering mask, the formation of a reference pattern through an opening in the mask, and the formation of masks defining circuit elements centered on this reference pattern, characterized in that the method comprises the manufacture of at least one circuit element provided with electrically insulating means in lateral regions, in that the formation of the centering mask of the masks defining the integrated circuit elements is achieved by a first mask defining the lateral insulation regions of this circuit element, in that no centering mask separate from the first mask is used, and in that the formation of the reference pattern is obtained by the pattern formed by etching, through the first mask, to a depth which does not exceed the thickness of the upper layer of the stack of layers in said lateral insulation regions.

2. A method as claimed in claim 1, characterized in that the circuit element is laterally insulated in the regions defined by said first mask by ion implantation in the stack of layers.

3. A method as claimed in claim 1, characterized in that the formation of the stack of layers comprises at least the manufacture of a heterostructure so that the circuit element provided with electrically insulating means forms a pseudomorphic transistor having a high electron mobility.

4. A method as claimed in claim 1, characterized in that the semiconductor device is manufactured in a monolithically integrated manner using semiconductor materials of group III–V.

* * * * *